(12) United States Patent
Seuring et al.

(10) Patent No.: US 7,537,657 B2
(45) Date of Patent: *May 26, 2009

(54) SILICON WAFER AND PROCESS FOR PRODUCING IT

(75) Inventors: Christoph Seuring, Burghausen (DE); Robert Hoelzl, Postmuenster (DE); Reinhold Wahlich, Tittmoning (DE); Wilfried Von Ammon, Hochburg (AT)

(73) Assignee: Siltronic AG, Munich (DE)

( * ) Notice: Subject to any disclaimer, the term of this patent is extended or adjusted under 35 U.S.C. 154(b) by 50 days.

This patent is subject to a terminal disclaimer.

(21) Appl. No.: 11/477,705

(22) Filed: Jun. 29, 2006

(65) Prior Publication Data

US 2006/0278157 A1    Dec. 14, 2006

Related U.S. Application Data

(62) Division of application No. 10/893,522, filed on Jul. 16, 2004, now Pat. No. 7,235,863.

(30) Foreign Application Priority Data

Aug. 7, 2003    (DE) ................ 103 36 271

(51) Int. Cl.
C30B 15/00 (2006.01)
H01L 29/30 (2006.01)
H01L 21/00 (2006.01)

(52) U.S. Cl. ............... 117/13; 117/15; 117/17; 117/19; 117/201; 117/202; 117/203; 257/610; 257/611; 257/617; 438/58; 438/689

(58) Field of Classification Search ................. 257/610, 257/611, 617; 117/13, 15, 17, 19, 201–203; 438/58, 689

See application file for complete search history.

(56) References Cited

U.S. PATENT DOCUMENTS

| | | | |
|---|---|---|---|
| 4,824,698 | A | 4/1989 | Jastrzebski et al. |
| 5,994,761 | A | 11/1999 | Falster et al. |
| 6,129,787 | A | 10/2000 | Adachi et al. |
| 6,228,164 | B1 | 5/2001 | Ammon et al. |
| 6,423,615 | B1 | 7/2002 | Ravi et al. |
| 6,500,732 | B1 | 12/2002 | Henley et al. |
| 6,548,886 | B1 | 4/2003 | Ikari et al. |
| 6,579,779 | B1 | 6/2003 | Falster |
| 6,583,050 | B2 | 6/2003 | Wenski et al. |
| 6,599,603 | B1 | 7/2003 | Kato et al. |
| 6,803,331 | B2 | 10/2004 | Holzl et al. |
| 7,208,043 | B2 * | 4/2007 | Tachikawa et al. ............ 117/20 |
| 2003/0124815 | A1 | 7/2003 | Henley et al. |
| 2003/0148634 | A1 * | 8/2003 | Holzl et al. .................. 438/795 |
| 2004/0142542 | A1 | 7/2004 | Murphy et al. |
| 2005/0070076 | A1 | 3/2005 | Dion |
| 2007/0054459 | A1 * | 3/2007 | Aga et al. .................... 438/311 |

FOREIGN PATENT DOCUMENTS

| | | |
|---|---|---|
| DE | 199 41 902 | 3/2001 |
| DE | 102 05 084 | 8/2003 |
| EP | 0 973190 | 1/2000 |
| EP | 1035235 | 9/2000 |
| EP | 1 087 042 | 3/2001 |
| JP | 11-260677 A | 9/1999 |
| JP | 2003-086595 A | 3/2003 |
| WO | WO 98/38675 | 9/1998 |
| WO | WO 99/57344 | 11/1999 |

OTHER PUBLICATIONS

English Derwent Abstract AN 2003-745143 corres. to DE 102 05 084.
English Derwent Abstract AN 2001-204 390 corres. to DE 199 41 902.
"Properties of Crystalline Silicone", 1999, The Institution of Electrical Engineers, 20.
"Semiconductor Silicon 2002", vol. 2, p. 565, Huff, M.R., Fabry, &., Kishino, S. (Eds.).

* cited by examiner

*Primary Examiner*—Robert M Kunemund
*Assistant Examiner*—G. Nagesh Rao
(74) *Attorney, Agent, or Firm*—Brooks Kushman P.C.

(57) ABSTRACT

A process for producing a single-crystal silicon wafer, comprises the following steps:
producing a layer on the front surface of the silicon wafer by epitaxial deposition or production of a layer whose electrical resistance differs from the electrical resistance of the remainder of the silicon wafer on the front surface of the silicon wafer, or production of an external getter layer on the back surface of the silicon wafer, and
heat treating the silicon wafer at a temperature which is selected to be such that an inequality (1)

$$[Oi] < [Oi]^{eq}(T)\exp\frac{2\sigma_{SiO2}\Omega}{rkT}$$

is satisfied, where [Oi] is an oxygen concentration in the silicon wafer, $[Oi]^{eq}(T)$ is a limit solubility of oxygen in silicon at a temperature T, $\sigma_{SiO2}$ is the surface energy of silicon dioxide, $\Omega$ is a volume of a precipitated oxygen atom, r is a mean COP and k the Boltzmann constant, with the silicon wafer, during the heat treatment, at least part of the time being exposed to an oxygen-containing atmosphere.

27 Claims, No Drawings

SILICON WAFER AND PROCESS FOR PRODUCING IT

This application is a division of and claims priority to U.S. application Ser. No. 10/893,522 filed Jul. 16, 2004, now U.S. Pat. No. 7,235,863 and also claims priority to German Application DE 103 362 71.1 filed Aug. 7, 2003.

BACKGROUND OF THE INVENTION

1. Field of the Invention

The invention relates to a silicon wafer and to a process for producing the silicon wafer which encompasses a heat treatment of the silicon wafer.

2. The Prior Art

The prior art has disclosed silicon wafers which, for various purposes, have layers on their front or back surface. For example, to establish a vertical resistance profile, silicon wafers are provided with an epitaxial layer on their front surface which, at least with respect to a dopant, has a concentration which differs from the remainder of the silicon wafer. The same purpose is also fulfilled by outdiffusion of a dopant contained in the wafer as a result of a heat treatment, for example in a hydrogen atmosphere. In particular, layers which act as external getters for various types of impurities, e.g. metals, with which the silicon wafer becomes contaminated during the fabrication of electronic components are produced on the wafer back surface. The layer, which consists, for example, of silicon oxide, silicon nitride or polycrystalline silicon, by means of the lattice mismatch generates a structurally disturbed region which acts as a getter center, i.e. binds impurities.

The silicon wafers are produced from silicon single crystals, which are divided into wafers and are subjected to numerous processing steps in order to obtain the desired surface quality.

Silicon single crystals, which are generally produced using the Czochralski crucible pulling process or using the crucible-free float zone process, have a number of defects. If no special precautions are taken, the defects are also present at the surface of the wafers, where they have an adverse effect on the functioning of the electronic components fabricated thereon.

One significant type of defect is what are known as COPs (crystal originated particles), groups of vacancies which combine to form small voids with sizes of typically between 50 and 150 nm. These defects can be measured using numerous methods. Partial etching of the defects by means of an SC1 solution ($NH_3/H_2O_2/H_2O$) at approximately 85° C. for 20 min followed by light scattering measurement is one possible option for testing for COPs on the wafer surface. Partial etching of the defects by means of a Secco etch for 30 min, removing approximately 30 μm of silicon, followed by counting, also makes it possible to reveal these defects. If the defects which have what is known as a flag are counted, they are referred to as FPDs (flow pattern defects). The result obtained is an FPD density per unit area, which can be converted into a density per unit volume taking account of the material removed during the preparatory etch. The same defects can also be measured by IR-LST (infra-red light scattering tomography), in which an Nd-YAG laser beam is scattered at the defects in the silicon wafer and the scattered light is detected at an angle of 90° to the laser beam. These defects are referred to as LSTD defects after their measurement method.

Numerous component parameters are adversely affected by the COPs when components are being fabricated on the semiconductor wafer. Therefore, it is necessary for these defects to be removed at least in the layer of a silicon wafer that is active in terms of the components.

European Patent EP 973 190 A2 teaches subjecting a single-crystal silicon wafer which, on its back surface, bears an external getter layer of polycrystalline silicon to a heat treatment at a temperature between 1150 and 1350° C. in a hydrogen-containing atmosphere in order to remove the COPs at the surface of the silicon wafer.

U.S. Pat. No. 6,423,615 teaches that the dopant concentration in a layer close to the surface is altered by means of a heat treatment in a hydrogen-containing atmosphere, so that a vertical resistance profile is generated. A layer of this type with an altered dopant concentration at the front surface of the silicon wafer is required for many component processes.

It is also known that by means of an epitaxial deposition on the front surface of the silicon wafer, it is possible to generate a layer which has a different dopant concentration and is free of COPs.

Therefore, the prior art has disclosed silicon wafers which, on the front or back surface, bear at least one of the above-mentioned layers and the surface of which, at least on the front surface, is substantially free of COPs.

The remainder of the silicon wafer, known as the bulk, however, is not free of COPs. This is disadvantageous in particular if components which require a particularly deep COP-free layer at the surface, for example in the case of components in which what is known as the deep trench technologies are employed, are fabricated on the silicon wafer. The maximum depth of the component has been restricted to the thickness of the COP-free layer. Moreover, the growth of a thick epitaxial layer-which is suitable for deep trench technology is very time-consuming and therefore expensive.

SUMMARY OF THE INVENTION

The object on which the invention is based consists in providing a silicon wafer having the known layers on the front or back surface which is free of COPs not just in a layer close to the surface, but over a substantial part of the wafer thickness.

The object is achieved by a process for producing a single-crystal silicon wafer, comprising the following steps:

production of a layer on the front surface of the silicon wafer by epitaxial deposition or production of a layer whose electrical resistance differs from the electrical resistance of the remainder of the silicon wafer on the front surface of the silicon wafer, or production of an external getter layer on the back surface of the silicon wafer, and heat treatment of the silicon wafer at a temperature which is selected to be such that the inequality (1)

$$[Oi] < [Oi]^{eq}(T)\exp\frac{2\sigma_{SiO_2}\Omega}{rkT}$$

is satisfied, with the silicon wafer, during the heat treatment, at least from time to time being exposed to an oxygen-containing atmosphere.

In this context, [Oi] denotes the oxygen concentration in the silicon wafer, more specifically the concentration of the interstitially dissolved oxygen, which is generally determined by FTIR spectroscopy. $[Oi]^{eq}(T)$ is the limit solubility of oxygen in silicon at a given temperature T. A function of this type is disclosed, for example, in Hull, R. (Ed.), "Properties of Crystalline Silicon", The Institution of Electrical Engineers, London, 1999, page 489ff. $\sigma_{SiO2}$ is the surface energy of silicon dioxide ($SiO_2$), which is given in Huff, H. R., Fabry, L., Kishino, S. (Eds.), "Semiconductor Silicon 2002", volume 2, The Electrochemical Society, Pennington, 2002, page 545 as 310 erg/cm². $\Omega$ is the volume of a precipitated oxygen atom, which is calculated from the molar mass $M_{SiO2}$ and the density $\rho_{SiO2}$ of silicon dioxide and the Avogadro number NA using the relationship $\Omega = M_{SiO2}/(2\rho_{SiO2} NA)$. r stands for the mean COP radius, k for the Boltzmann constant and T for the temperature in K.

The layer on the front surface of the silicon wafer, i.e. on that surface of the wafer which is intended for the fabrication of components, is produced by means of one of the methods with which the person skilled in the art will be familiar.

For example, it is possible for an epitaxial layer consisting of silicon to be deposited on the surface with the aid of a CVD process. In this case, a suitable doping gas, which causes the dopant to be incorporated in the crystal lattice of the deposited silicon in the desired concentration, is admixed with the process gas. In this way, the electrical resistance is set to the desired value. The resistance of the epitaxial layer may differ from the resistance of the remainder of the silicon wafer or may be identical to it. Furthermore, in general the mechanical properties of the epitaxially deposited layer and of the remainder of the silicon wafer will be different. The epitaxial layer, on account of its favorable mechanical properties, leads to a high yield in the fabrication of components.

It is also possible for other layers to be deposited epitaxially, for example silicon-germanium or a combination of silicon and silicon-germanium layers, for example strained silicon. These layers likewise generally have a different electrical resistance or different mechanical properties than the remainder of the silicon wafer, which is also referred to as the substrate.

As an alternative to the deposition of epitaxial layers, it is possible for a layer with an electrical resistance which differs from the remainder of the silicon wafer to be produced on the front surface of the silicon wafer by means of a heat treatment under a suitable atmosphere, which causes the dopant contained in the silicon wafer to diffuse out of the surface. If the silicon wafer is doped with boron, phosphorus, arsenic, gallium, aluminum or antimony, this can be effected, for example, by a heat treatment in a hydrogen-containing atmosphere.

However, it is also possible to use any other desired method which cause the superficial layer at the wafer front surface to acquire an electrical resistance which differs in value from the remainder of the silicon wafer in the desired way.

It is preferable for a suitable CVD process of the prior art to be used to apply an external getter layer to the back surface of the silicon wafer, for example a layer which contains silicon oxide, silicon nitride, silicon oxynitride or polycrystalline silicon. In the case of silicon oxide, thermal or wet-chemical oxidation of the surface is also possible. In this context, the term external getter denotes a layer on the back surface of the wafer which appears structurally disturbed compared to the regular silicon crystal structure. This structural disturbance may also be produced by mechanical damage to the wafer back surface or ion implantation into a superficial layer of the back surface, for example an implantation of helium ions with a subsequent implantation anneal.

The production of the described layers on the front or back surface of the silicon wafer may take place either before or after the heat treatment of the invention corresponding to inequality (1).

A crucial factor for the process according to the invention is that the temperature during the heat treatment be selected to be sufficiently high for the oxygen concentration in the equilibrium with the oxide skin of a COP surface (i.e. the right-hand side of inequality (1)) to exceed the concentration of interstitially dissolved oxygen atoms [Oi]. Consequently, the concentration of the interstitial oxygen is below the saturation concentration, with the result that the oxide skin of the COPs can be dissolved by diffusion of the oxygen atoms into the crystal lattice. The inner oxide skin of the COPs is dissolved as a result of diffusion of the oxygen atoms into the crystal lattice wherever the abovementioned condition for the temperature is satisfied. After the loss of the oxide skin, the COPs begin to shrink through diffusion of vacancies or interstitial silicon atoms, so that the COPs are dissolved.

By contrast, the heat treatment according to the prior art is based on the outdiffusion of oxygen at the surface of the silicon wafer. The interstitially dissolved oxygen diffuses out at the surface. The COPs, which are covered with a thin oxide skin with a thickness of approximately 2 nm, lose their oxide skin on account of Le Chatelier's principle. They then shrink continuously, since a silicon wafer thermodynamically represents an open system, so that the vacancies which are in equilibrium with the COPs can diffuse out at the surface. In the bulk of the wafer, the oxygen cannot diffuse out. Instead, in this region the COPs begin to fill up with oxide and subsequently become larger.

In contrast to a heat treatment according to the prior art, in the process according to the invention the COPs in the bulk also dissolve, since outdiffusion of oxygen is not A required, on account of the high temperature which is selected according to the invention and leads to oxygen subsaturation. Therefore, the method according to the invention can be carried out under an atmosphere which at least from time to time contains oxygen. As a result, the superficial oxide layer, which acts as a diffusion barrier against metal contaminations, is retained, resulting in significant advantages with regard to metal contamination compared to the methods of the prior art, which are restricted to special atmospheres of hydrogen or argon.

The invention also relates to a single-crystal silicon wafer which, down to a depth corresponding to at least 50% of the wafer thickness, has a COP density of less than 10,000 cm$^{-3}$ and, on its back surface, bears an external getter layer.

Known external getter layers contain for example silicon oxide, silicon nitride, silicon oxynitride or polycrystalline silicon, dopant atoms incorporated by ion implantation or layers formed by mechanical damage.

The invention also relates to a single-crystal silicon wafer which, down to a depth which corresponds to at least 50% of the wafer thickness, has a COP density of less than 10,000 cm$^{-3}$ and, on its front surface, bears a layer which has been deposited epitaxially or the electrical resistance of which differs from the electrical resistance of the remainder of the silicon wafer.

The layer on the front surface of the silicon wafer is preferably an epitaxially deposited layer which consists of silicon or contains silicon-germanium. A layer which contains strained silicon is also preferred. When producing strained silicon, a layer $Si_{1-x}Ge_x$, where x increases gradually, is generally deposited. This causes the crystal lattice to expand. The final layer deposited is once again pure silicon, which has the higher lattice constant of the top part of the $Si_{1-x}Ge_x$ layer on which it has been deposited. The expanded lattice constant of this strained silicon layer leads to increased electron mobility, which brings with it advantages in component fabrication.

A layer which has been produced by outdiffusion of a dopant as a result of a heat treatment under a suitable atmosphere, for example in a hydrogen-containing atmosphere, is also preferred.

The advantage of the silicon wafers according to the invention over the corresponding wafers of the prior art consists in the fact that, on account of the substantial absence of COPs, no GOI defects occur during the fabrication of electronic components. In the case of a layer with an electrical resistance that is different than the substrate, the advantage of the silicon wafers according to the invention resides in the fact that in the case of structures whose vertical extent is greater than that of the applied layer (e.g. deep trenches), there is no incidence of trench-to-trench short circuits or leakage current problems, which if substrate material with crystal defects, such as in particular COPs, is used can lead to the failure of components.

DETAILED DESCRIPTION OF THE PREFERRED EMBODIMENTS

The following describes preferred embodiments for the individual steps of the process according to the invention.

The starting material used for the process according to the invention is preferably silicon wafers with a low oxygen concentration, since in this case the temperature required to satisfy inequality (1) is reduced, as the table below demonstrates. An oxygen concentration of $[Oi] < 7 \cdot 10^{17}$ at/cm$^3$ is particularly preferred. In the case of the Czochralski process, this can be achieved for example by altered process parameters such as crucible rotation. The lower the oxygen concentration in the silicon crystal, the lower the minimum temperature for the heat treatment process according to the invention. A reduction in the process temperature in turn reduces the outlay on apparatus and the time required for heating and cooling, and therefore the process costs.

Since the time required to dissolve the oxide skin of the COPs is also dependent on the thickness of the oxide skin (cf. table), in the context of the process according to the invention it is preferable to use a starting material whose COPs have the thinnest possible oxide skin. The thickness of the oxide skin is preferably less than 4 nm, particularly preferably less than 2 nm. This is achieved by means of a low oxygen concentration and rapid cooling rates during the crystal pulling in a temperature range from 1200° C. to 600° C.

The time which is required to dissolve the COPs from which the oxide skin has been removed is substantially dependent on the size of the COPs (cf. table). Therefore, it is preferable for the starting material used for the heat treatment according to the invention to be silicon wafers which have been obtained from a single crystal whose pulling process during fabrication has been controlled in such a way that a high concentration of very small COPs is formed. In the case of a silicon crystal with a diameter of 300 mm, the mean COP diameter should be less than 160 nm, preferably less than 150 nm and particularly preferably less than 120 nm. For silicon crystals with a diameter of 200 mm, COP sizes of <100 nm, preferably <80 nm, particularly preferably <60 nm are to be selected. In the pulling process, this is achieved by the crystal being cooled as quickly as possible in the temperature range between 1200° C. and 900° C. For this purpose, cooling rates of from 1 to 20 K/min, preferably from 2 to 15 K/min and particularly preferably from 5 to 15 K/min have to be set within this temperature range. In addition to the small size of the COPs which are formed, a pulling process of this type has the advantage of being associated with a relatively high pulling rate, which shortens the process time. Furthermore, pulling processes of this type in principle give high yields, which further increases the economic viability.

To further reduce the mean COP size, it is preferable to add nitrogen during the pulling process. A nitrogen concentration in the single crystal or in the silicon wafer produced therefrom which is in the range between $1 \cdot 10^{13}$ and $7 \cdot 10^{15}$ at/cm$^3$ is particularly preferred. U.S. Pat. No. 6,228,164 B1 and German Patent No. DE 199 41 902 A1 describe the technical background.

The following table summarizes the effects of the oxygen concentration [Oi], of the COP diameter 2r and of the thickness d of the COP oxide skin on the temperature T required for the process according to the invention and the time t required to dissolve the COPs.

| $[O_i]$ [$10^{17}$ at/cm$^3$] | 2r [nm] | d [nm] | T [° C.] | t [sec] |
|---|---|---|---|---|
| 6.5 | 70 | 2 | 1300 | 122 |
| 6.5 | 70 | 4 | 1300 | 133 |
| 6.5 | 70 | 2 | 1350 | 41 |
| 6.5 | 120 | 2 | 1350 | 366 |
| 5.0 | 70 | 2 | 1220 | 714 |
| 6.0 | 70 | 2 | 1220 | 797 |
| 7.0 | 70 | 2 | 1220 | 1090 |
| 8.0 | 70 | 2 | 1220 | ∞ |
| 5.0 | 70 | 2 | 1250 | 369 |
| 6.0 | 70 | 2 | 1250 | 390 |
| 7.0 | 70 | 2 | 1250 | 432 |
| 8.0 | 70 | 2 | 1250 | 552 |
| 9.0 | 70 | 2 | 1250 | ∞ |

To further reduce the time required to dissolve the COPs, the starting material used for the process according to the invention is preferably a silicon wafer whose COPs have a morphology with a large area/volume ratio. This requirement is satisfied either by flattened or elongated COPs. One way of producing a starting material of this type is described, for example, in EP 1 087 042 A1.

The starting material used may be material of all conduction types, particularly preferably of p- and n-type conduction, and it is also possible to use silicon wafers with any desired crystallographic orientation, preferably having orientations 111, 110, 115 and 113. Furthermore, it is possible to use what are known as ring wafers as starting material. These are silicon wafers which contain COPs only in an area with a radius which is smaller than the radius of the wafer, adjoined by what is known as an OSF ring region (an abbreviation of "oxidation induced stacking fault").

In the context of the process according to the invention, the silicon wafer which is to be treated is first preferably heated in an RTA (rapid thermal annealing) reactor in accordance with the prior art at a predetermined rate until the temperature range determined by the inequality (1) has been reached. The silicon wafer is then held in this temperature range for a predetermined time and is then cooled again at a predetermined rate. The heating of the silicon wafer in the RTA reactor can be effected by resistance heating, lamps, inductively or with the aid of a laser.

When storing the silicon wafer in the process chamber, it should be ensured that it is impossible for any gravity-induced slips to form at the high process temperature. For this purpose, the wafer, depending on the design of the process chamber, can rest on a suitably shaped supporting structure, can be mounted vertically in a holder or can be made to float on a gas cushion by means of suitable devices with which the person skilled in the art will be familiar. It is preferable for the wafers to be pre-sorted on the basis of the geometry parameters warp and bow in a manner which is matched to the particular geometry of the wafer supporting structure.

In general, just one silicon wafer is heat-treated in the RTA reactor. However, it is also possible for sets of a plurality of silicon wafers, the surfaces of which rest on one another, to be treated (stacked RTA). The advantage in this case is a higher throughput of wafers per unit time. For this variant, it is preferable to use silicon wafers whose surface roughness prevents the wafers from sticking together during the heat treatment.

The heat treatment of an ingot piece of the silicon single crystal is also possible, since with a heat treatment which satisfies inequality (1) there is no need for outdiffusion of the oxygen from a surface layer. The ingot piece is only separated into wafers after the heat treatment and then processed further in accordance with the prior art. In this case too, the advantage lies in a higher throughput of silicon wafers per hour. It is preferable for the ingot piece not to rest directly on the wafer support, but rather on a thick silicon wafer which in turn rests on the silicon support. This counteracts the formation of slipping in the ingot piece, since stresses which are caused by irregularities in the support geometry are absorbed by the thick wafer.

To avoid thermal inhomogeneities, which may be caused by the process chamber heating, it is possible for a second silicon wafer to be positioned above the silicon wafer which is to be processed, acting as a shield against the direct radiation of, for example, lamps and also acting as heat distributor.

At the start of the heat treatment, it is preferable to select a heating rate which is as high as possible, in order not to allow the oxide skin of the COPs to grow during the heating, i.e. to select a heating rate of more than 2 K/s, preferably a heating rate of more than 10 K/s and particularly preferably a heating rate of 50 K/s or more.

The time during which the temperature of the silicon wafer is held in the range which is predetermined by inequality (1) is dependent on the starting material used. As shown in the table, the duration of the heat treatment can be reduced by using a starting material with small COPs and a thin COP oxide skin. The typical time is between 10 s and 15 min, preferably between 30 s and 5 min, and particularly preferably between 30 s and 4 min.

The pressure inside the process chamber may be below atmospheric pressure during the heat treatment, and it is also possible for the silicon wafer, during the heat treatment, additionally to be exposed to electromagnetic radiation in the UV region and plasmas and ionizing radiation, in order, for example, to smooth the surface.

The cooling rate to be set is determined by the desired properties of the end product, i.e. of the silicon wafer after the heat treatment. If the intention is to produce a silicon wafer which does not have any additional internal gettering properties and does not present any oxygen precipitation during a subsequent component process, a slow cooling operation is preferred. On the other hand, if a silicon wafer with good internal gettering properties is to be produced, it is preferable for the cooling rate to be set to be sufficiently high for an RTA effect to occur, as described, for example, in WO 98/38675. The term RTA effect denotes the establishment of a defined oxygen precipitation behavior with a defined "denuded zone" and corresponding precipitation behavior in the bulk of the silicon wafer.

During the heat treatment, at least from time to time the silicon wafer is exposed to an atmosphere which contains oxygen. This makes it possible to reduce the risk of metal contamination of the wafer by the process environment. The silicon wafer may be heat treated both in a uniform atmosphere and in an atmosphere which is altered during the process. The front and back surfaces of the wafer may be exposed either to the same atmosphere or to different atmospheres. Depending on the desired properties of the end product, it is possible to use noble gases (preferably argon), nitrogen, oxygen and chemical compounds which contain said elements as well as all mixtures that can be produced from these gases (elements or compounds). However, mixtures whose constituents would react with one another in an uncontrolled manner at the required high temperatures are excluded.

It is preferable for the silicon wafer to be exposed, during the heat treatment according to the invention which satisfies inequality (1), to an atmosphere which causes the surface of the silicon wafer to be covered with an oxide layer throughout the entire duration of the heat treatment. An atmosphere which contains oxygen and argon is particularly preferred. In this case, COPs are eliminated from the bulk of the silicon wafer. In this case, however, this does not apply to the surface, since oxygen diffuses in here, with the result that the oxide skin is not removed from the COPs close to the surface, and consequently these COPs are not dissolved. However, the surface can then be removed by mechanical or chemical means, for example by grinding or chemical mechanical polishing, so that ultimately a COP-free silicon wafer is obtained once again. The silicon wafer may also be subjected, after the heat treatment according to the invention which satisfies inequality (1), to a further heat treatment in a reducing, for example hydrogen-containing atmosphere, in order to remove firstly the oxide layer and then the COPs close to the surface. This step can simultaneously be used for outdiffusion of a dopant and therefore for production of a layer with a differing resistance.

DETAILED DESCRIPTION OF THE PREFERRED EMBODIMENTS

The following text describes preferred sequences of the overall process according to the invention and the preferred products producible thereby:

In a first preferred embodiment, a silicon wafer is provided on the front surface and back surface with an external getter layer of, for example, polycrystalline silicon, silicon nitride, silicon oxynitride, thermal oxide or CVD oxide. An oxygen-containing getter layer is particularly preferred, since in this case, in addition to the external gettering action of the layer, a diffusion barrier for metal contamination is built up, and therefore the silicon wafer is less sensitive to potential metallic contamination during the heat treatment. The silicon wafer is then subjected to a heat treatment which satisfies inequality (1). After the heat treatment, the external getter layer on the wafer front surface is removed using known processes. Then, an epitaxial layer, the thickness of which depends on the application for which the silicon wafer is intended, is deposited on the uncovered wafer front surface using a process which forms part of the prior art.

The thickness of this layer may be in the range from 0.1 μm to 10 μm. This process produces a silicon wafer which, during the heat treatment according to the invention, is protected by a diffusion barrier and in addition includes an external getter layer, which binds any metal contamination which reaches the wafer surface through the diffusion barrier in the external getter layer on the wafer back surface, keeping it away from the layer which is of relevance to the component.

In a second preferred embodiment of the invention, an uncoated, blank silicon wafer is subjected to the heat treatment according to the invention and then coated with an external getter layer, as described above. This is followed by the removal of the getter layer from the wafer front surface and the application of the epitaxial layer of the desired thickness to the wafer front surface.

In a third preferred embodiment of the invention, a silicon wafer which has been entirely provided with an external getter layer in accordance with the first preferred embodiment is subjected to the heat treatment according to the invention, followed by a further heat treatment in a hydrogen-containing atmosphere for the purpose of causing the hydrogen-containing atmosphere to dissolve the getter layer on the wafer front surface and removing the COPs in the surface layer. If the wafer support is selected appropriately, the hydrogen-containing atmosphere cannot act on the wafer back surface, but only detaches the getter layer from the wafer front surface. Then, the wafer from which the getter layer has been removed on one side in this way is provided with an epitaxial layer.

In a fourth preferred embodiment, a silicon wafer which has been entirely provided with an external getter layer in accordance with the first embodiment is subjected to the heat treatment according to the invention, followed by a further heat treatment in a hydrogen-containing atmosphere for the purpose of using the hydrogen-containing atmosphere to dissolve the getter layer on the wafer front surface. If the wafer support is selected appropriately, the hydrogen-containing atmosphere cannot act on the wafer back surface, but only detaches the getter layer from the wafer front surface. Then, the heat treatment of the silicon wafer under the hydrogen-containing atmosphere is continued. The result of this is that outdiffusion of the dopant can commence on the wafer front surface, from which the external getter layer has been removed, leading to a layer with a different electrical resistance than the substrate.

In a fifth preferred embodiment of the invention, a silicon wafer which has been provided with an external getter layer in accordance with the first preferred embodiment has the external getter layer removed from it on the front surface by means of a process with which the person skilled in the art will be familiar, and then the wafer is subjected to the heat treatment according to the invention. After this, any oxide which may have formed on the front surface as a result of the heat treatment is removed, and the front surface of the wafer is subjected to epitaxial deposition.

In a sixth preferred embodiment of the invention, a silicon wafer which has been provided with an external getter layer in accordance with the first preferred embodiment has the external getter layer removed from its front surface by means of a process with which the person skilled in the art is familiar, and the wafer is then subjected to the heat treatment according to the invention. This is followed by a further heat treatment in a hydrogen-containing atmosphere, during the course of which any surface oxide which may have formed during the heat treatment according to the invention on the wafer front surface is dissolved, after which outdiffusion of the dopant out of a surface layer can take place. The end product is a wafer with an external getter and a component-relevant layer with an electrical resistance which differs from the remainder of the silicon wafer.

In a seventh preferred embodiment of the invention, an uncoated silicon wafer is subjected to the heat treatment according to the invention. This is followed by a further heat treatment in order to deposit polycrystalline silicon on the wafer as an external getter layer with the aid of a process with which the person skilled in the art will be familiar. The polycrystalline silicon layer obtained in this way is removed on the front surface of the silicon wafer by mechanical or chemical action, for example by grinding or chemical mechanical polishing. Then, an epitaxial layer is deposited on the front surface.

In an eighth preferred embodiment of the invention, a ground and etched silicon wafer is provided with an oxide layer as diffusion barrier with the aid of a process with which the person skilled in art will be familiar, and the wafer is then subjected to the heat treatment according to the invention. The oxide is then removed from the wafer with the aid of a standard process, such as for example etching. Next, the wafer is subjected to double-sided polishing. In a further heat treatment, a polycrystalline silicon layer is deposited on the polished wafer, and this layer is removed from the front surface using a process with which the person skilled in the art will be familiar. The end product is a wafer which has undergone double-sided polishing and, as a result of this double-sided polishing, has an improved nanotopology, and which is provided with an external getter layer for binding metallic contamination in a zone far removed from the layer which is of relevance to the component.

The invention can be applied to single-crystal silicon wafers irrespective of the crystal diameter or wafer diameter. It is preferable for the invention to be applied to wafers with a diameter of 15, 20 or 30 cm or more. Since the components which are fabricated on silicon wafers of large diameter impose significantly greater demands with regard to the absence of defects in the silicon, it is particularly preferable for the invention to be applied to silicon wafers of large diameter.

Due to the absence of crystal defects in the silicon wafer according to the invention, this wafer is particularly suitable for the production of what are known as SOI (silicon on insulator) wafers, in which the upper, component-relevant layer must not have any crystal defects, since otherwise defects may continue into the electrically insulating layer (buried oxide) below. The silicon wafer according to the invention is particularly suitable as a donor wafer for production of the thin component-relevant silicon layer of SOI wafers by means of layer transfer techniques.

The silicon wafer according to the invention, due to its complete absence of defects, can also be reused a number of times as a donor wafer after removal of a surface layer as part of a layer transfer process (SOI rework).

The silicon wafer according to the invention can also be used as an inexpensive particle monitor wafer. The wafer can be cleaned again and if appropriate also polished again after any particle loading has occurred, without the polishing causing crystal defects to become visible on the wafer surface.

A further application area for the silicon wafer according to the invention is what are known as MEMS or RFID applications. These are often disposable articles (RFID: for example theftproof security features on CD cases) which nevertheless have to be produced from silicon base material of high quality and with an absence of defects. The invention provides an inexpensive method for producing the starting material.

What is claimed is:

1. A process for producing a single-crystal silicon wafer, comprising the following steps a) and b):
   a) producing a layer on the silicon wafer, said layer having one of the following characteristics:
      i) said layer is produced on a front surface of the silicon wafer by epitaxial deposition;
      ii) a front surface of said layer has an electrical resistance that differs from electrical resistance of a remainder of the silicon wafer;
      iii) said layer is an external getter layer on a back surface of the silicon wafer, and b) heat treating the silicon wafer at a temperature which is selected such that the inequality (1)

$$[Oi] < [Oi]^{eq}(T)\exp\frac{2\sigma_{SiO2}\Omega}{rkT} \quad 5$$

is satisfied, where [Oi] is an oxygen concentration in the silicon wafer, $[Oi]^{eq}(T)$ is a limit solubility of oxygen in silicon at a temperature T, $\sigma_{SiO2}$ is the surface energy of silicon dioxide, $\Omega$ is the volume of a precipitated oxygen atom, r is a mean COP radium and k is the Boltzmann constant, with the silicon wafer being exposed to an oxygen-containing atmosphere during at least a portion of said heat treating, and wherein the wafer is heated to the temperature of heat treating at a rate of 2K/s or more.

2. The process of claim 1, wherein said wafer has a COP density greater than $1 \cdot 10^4/cm^3$, and following said heat treating, the COP density is lowered to less than $1 \cdot 10^4/cm^3$ through a depth of at least 50% of the wafer thickness from the front side of the wafer.

3. The process of claim 1, wherein the wafer is held at the heat treating temperature for not more than 4 minutes.

4. The process of claim 1, wherein a starting material used for the process is a silicon wafer with an oxygen concentration $[Oi] < 7 \cdot 10^{17}$ at/cm$^3$.

5. The process of claim 1, wherein a starting material used for the process is a silicon wafer with a mean COP diameter of less than 160 nm.

6. The process of claim 1, wherein the step of heat treating comprises the following steps:
heating the silicon wafer at a heating rate until the temperature is within a range in which inequality (1) is satisfied;
holding the temperature in said range for a time sufficient to dissolve COPs; and
cooling the silicon wafer at a cooling rate, said steps being performed in that order.

7. The process of claim 6, wherein a time during which the temperature is within the range in which inequality (1) is satisfied is between 10 seconds and 15 minutes.

8. The process of claim 1, wherein the layer is produced on the front surface of the silicon wafer by epitaxial deposition of a silicon-containing layer.

9. The process of claim 1, wherein the layer is produced on the front surface of the silicon wafer by means of a heat treatment in an atmosphere which leads to outdiffusion of at least one dopant.

10. The process of claim 1, wherein the layer is produced on a back surface of the silicon wafer by deposition of silicon oxide, silicon nitride or polycrystalline silicon.

11. The process of claim 1, wherein the steps of producing and heating comprise the following steps in the order given:
applying an external getter layer by deposition of silicon oxide, silicon nitride or polycrystalline silicon to the front and back surfaces of the silicon wafer,
heat treating the silicon wafer, so that inequality (1) is satisfied, in an oxygen-containing atmosphere,
removing the external getter layer on the front surface of the silicon wafer, and
epitaxially depositing a silicon-containing layer on the front surface of the silicon wafer.

12. The process of claim 1, wherein the steps of producing and heat treating comprise the following steps in the order given:
heat treating the silicon wafer, so that inequality (1) is satisfied, in an oxygen-containing atmosphere,
applying an external getter layer by deposition of silicon oxide, silicon nitride or polycrystalline silicon to the front and back surfaces of the silicon wafer,
removing the external getter layer on the front surface of the silicon wafer, and
epitaxially depositing a silicon layer on the front surface of the silicon wafer.

13. The process of in claim 1, wherein the steps of producing and heating comprise the following steps in the order given:
applying an external getter layer by deposition of silicon oxide, silicon nitride or polycrystalline silicon to the front and back surfaces of the silicon wafer,
heat treating the silicon wafer, so that inequality (1) is satisfied, in oxygen-containing atmosphere,
heat treating the silicon wafer in a hydrogen-containing atmosphere in order to remove the external getter layer on the front surface of the silicon wafer and in order to dissolve COPs that are present on the front surface, and
epitaxially depositing a silicon layer on the front surface of the silicon wafer.

14. The process of claim 1, wherein the steps of producing and heat treating comprise the following steps in the order given:
applying an external getter layer by deposition of silicon oxide, silicon nitride or polycrystalline silicon to the front and back surfaces of the silicon wafer,
heat treating the silicon wafer, so that inequality (1) is satisfied, in an oxygen-containing atmosphere, and
heat treating the silicon wafer in a hydrogen-containing atmosphere to remove the external getter layer on the front surface of the silicon wafer, to dissolve COPs that arc present on the front surface, and to produce the layer on the front surface by means of a heat treatment in an atmosphere which leads to outdiffusion of at least one dopant.

15. The process of claim 1, wherein the steps of producing and heat treating comprise the following steps in the order given:
applying an external getter layer by deposition of silicon oxide, silicon nitride or polycrystalline silicon to the front and back surfaces of the silicon wafer,
removing the external getter layer on the front surface of the silicon wafer,
heat treating the silicon wafer, so that inequality (1) is satisfied, in an oxygen-containing atmosphere, and
epitaxially depositing a silicon layer on the front surface of the silicon wafer.

16. The process of claim 1, wherein the steps of producing and heat treating comprise the following steps in the order given:
applying an external getter layer by deposition of silicon oxide, silicon nitride or polycrystalline silicon to the front and back surfaces of the silicon wafer;
removing the external getter layer on the front surface of the silicon wafer;
heat treating the silicon wafer, so that inequality (1) is satisfied, in an oxygen-containing atmosphere, and
heat treating the silicon wafer in a hydrogen-containing atmosphere to remove the external getter layer on the front surface of the silicon wafer, to dissolve COPs that are present on the front surface, and to produce the layer on the front surface by means of a heat treatment in an atmosphere which leads to outdiffusion of at least one dopant.

17. The process of claim 1, wherein the steps of producing and heat treating comprise the following steps in the order given:
   heat treating the silicon wafer, so that inequality (1) is satisfied, in an oxygen-containing atmosphere,
   applying an external getter layer by deposition of silicon oxide, silicon nitride or polycrystalline silicon to the front and back surfaces of the silicon wafer, the external getter layer consisting of polycrystalline silicon,
   removing the external getter layer on the front surface of the silicon wafer by mechanical or chemical action, and
   epitaxially depositing a silicon layer on the front surface of the silicon wafer.

18. The process of claim 1, wherein the steps of producing and heat treating comprise the following steps in the order given:
   oxidizing the front and back surfaces of a ground and etched silicon wafer in order to produce a silicon oxide layer,
   heat treating the silicon wafer, so that inequality (1) is satisfied, in an oxygen-containing atmosphere,
   removing the silicon oxide layer,
   simultaneously polishing the front and back surfaces of the silicon wafer,
   applying an external getter layer by deposition of silicon oxide, silicon nitride or polycrystalline silicon to the front and back surfaces of the silicon wafer, the external getter layer consisting of polycrystalline silicon, and
   removing the external getter layer on the front surface of the silicon wafer by mechanical or chemical action.

19. The process as claimed in claim 1, wherein the step of heat treating is carried out on a set of plurality of silicon wafers, the surfaces of which rest on one another.

20. The process as claimed in claim 1, wherein the step of heat treating is carried out on an ingot piece of a silicon single crystal, and the ingot piece is subsequently processed into wafers.

21. The process of claim 1, wherein the oxygen concentration of an ingot which is processed to the wafer is about $7\times10^{17}$ atoms/cm$^3$ or less.

22. The process of claim 1, wherein the wafer, prior to heat treating, has COPs with a mean size less than 160 nm, said COPs having an oxide skin with a thickness of about 4 nm or less.

23. The process of claim 5, wherein the COPs have an elongated or flattened morphology.

24. The process of claim 1, wherein said heating rate is greater than 10K/s.

25. The process of claim 1, wherein said heating rate is greater than 50K/s.

26. The process of claim 1, wherein substantially the entire step of heat treating takes place in an oxygen-containing atmosphere.

27. The process of claim 1, wherein said heat treating takes place in an RTA.

* * * * *